United States Patent [19]

Suzuki et al.

[11] Patent Number: 4,893,159
[45] Date of Patent: Jan. 9, 1990

[54] PROTECTED MOS TRANSISTOR CIRCUIT

[75] Inventors: Youichi Suzuki; Makoto Segawa, both of Yokohama; Shoji Ariizumi, Tokyo; Takeo Kondo, Yokosuka; Fujio Masuoka, Yokohama, all of Japan

[73] Assignee: Kabushiki Kaisha Toshiba, Kawasaki, Japan

[21] Appl. No.: 219,805

[22] Filed: Jul. 13, 1988

Related U.S. Application Data

[63] Continuation of Ser. No. 910,663, Sep. 23, 1986, abandoned.

[30] Foreign Application Priority Data

Sep. 25, 1985 [JP] Japan .................. 60-211419

[51] Int. Cl.$^4$ ............ H01L 29/78; H01L 27/02; H01L 29/04
[52] U.S. Cl. .................. 357/23.13; 357/20; 357/23.8; 357/41; 357/51; 357/52; 357/56; 357/59
[58] Field of Search .............. 357/23.13, 51, 56, 91, 357/52, 23.13, 20, 41, 23.8, 59 E, 59 G

[56] References Cited

U.S. PATENT DOCUMENTS

| | | | |
|---|---|---|---|
| 4,385,337 | 5/1983 | Asano et al. | 361/91 |
| 4,449,158 | 5/1984 | Taira | 357/23.13 |
| 4,527,213 | 7/1985 | Ariizumi | 357/23.13 |
| 4,688,065 | 8/1987 | Kinoshita et al. | 357/23.13 |
| 4,692,781 | 9/1987 | Rountree et al. | 357/23.13 |
| 4,733,285 | 3/1988 | Ishioka et al. | 357/51 |
| 4,763,184 | 8/1988 | Krieger et al. | 357/51 |

FOREIGN PATENT DOCUMENTS

| | | | |
|---|---|---|---|
| 0130412 | 1/1985 | European Pat. Off. | 357/23.13 |
| 54-101283 | 8/1979 | Japan | 357/23.13 |
| 54-140480 | 10/1979 | Japan | 357/23.13 |
| 55-72081 | 5/1980 | Japan | 357/23.13 |
| 56-35470 | 4/1981 | Japan | 357/23.13 |
| 56-83964 | 7/1981 | Japan . | |
| 57-45975 | 3/1982 | Japan | 357/23.13 |
| 57-190359 | 11/1982 | Japan | 357/23.13 |
| 57-190360 | 11/1982 | Japan | 357/23.13 |
| 59-224163 | 12/1984 | Japan | 357/23.13 |
| 61-53761 | 3/1986 | Japan | 357/23.13 |

OTHER PUBLICATIONS

Keller, "Protection of MOS Integrated Circuit from Destruction by Electrostatic Discharge", pp. 73-80, Proceedings of the 1980 Electrical Overstress/Electrostatic Discharge Symposium.

Fujishin et al., "Optimized ESD Protection Circuits for High-Speed MOS/VLSI," IEEE Journal of Solid-State Circuits, vol. SC-20, No. 2, pp. 594-596, Apr. 1985.

Primary Examiner—William D. Larkins
Assistant Examiner—Ngan Van Ngo
Attorney, Agent, or Firm—Finnegan, Henderson, Farabow, Garrett and Dunner

[57] ABSTRACT

This protected MOS transistor circuit has a p-type semiconductor substrate, VSS terminal, input MOS transistor, first resistor connected to the gate electrode of transistor, and MOS transistor which has a gate electrode connected to the VSS terminal and a current path connected between the VSS terminal and a junction of the first resistor and the gate electrode of the input MOS transistor. This protected MOS transistor circuit further has a second resistor connected in series with the first resistor, and pn-junction diode connected reversely between the VSS terminal and the junction of the first and second resistors.

8 Claims, 3 Drawing Sheets

PROTECTED MOS TRANSISTOR CIRCUIT

This application is a continuation of application Ser. No. 910,663, filed 09-23-87.

BACKGROUND OF THE INVENTION

The present invention relates to a protected MOS transistor circuit and, more particularly, to a MOS transistor integrated circuit having a protecting circuit for obviating rupture of the gate oxide of the MOS transistor on the same semiconductor substrate.

It is known that a relatively high voltage supplied to the gate of a MOS transistor becomes a cause of the rupture of a gate oxide. This rupture causes a permanent electrical short between the gate and the substrate on which the MOS transistor is formed.

FIG. 1 shows a conventional input protecting circuit for a MOS transistor integrated circuit. This protecting circuit protects the gate oxide of input MOS transistor 10 of the integrated circuit against rupture due to a surge voltage. For example, in a defect inspection process, the input terminal 12 of the integrated circuit accidentally receives a surge voltage from something charged, for example, to 2000 to 3000 V. Therefore, this protecting circuit is provided in the front stage of input MOS transistor 10.

As shown in FIG. 1, this protecting circuit has resistor 14 connected between the gate of MOS transistor 10 and input terminal 12. Resistor 14 is formed, for example, of a polycrystalline silicon layer formed over a semiconductor substrate through a field oxide film of 0.6 μm interposed therebetween or a diffused layer formed in the substrate and has resistance R. The protecting circuit further has MOS transistor 16 having the same characteristics as MOS transistor 10. The gate of transistor 16 and one end of a current path are connected to power terminal VSS set to a reference potential. The other end of the current path of transistor 16 is connected to junction 18 between resistor 14 and the gate of transistor 10.

A wiring connecting resistor 14 to transistor 10 is insulatively formed on a semiconductor substrate to form a parasitic capacitance C together with the substrate. The resistance R of resistor 14 and the parasitic capacitance C form a time constant circuit of time constant $\tau = CR$. The voltage of junction 18, i.e., the gate potential of transistor 10 gradually varies due to the time constant circuit after the surge voltage is supplied to terminal 12. Transistor 16 is rendered conductive when the potential variation arrives at a predetermined level. At this time, a punch-through current or a surface breakdown current flows from junction 18 to power terminal VSS to cause the charge stored in capacitance C to discharge. The voltage variation of the gate of transistor 10 is saturated at sufficiently low level as compared with the peak value of the surge voltage. Thus, the gate oxide of transistor 10 is not applied from the gate with a high electric field to prevent its rupture.

However, the construction of the conventional input protecting circuit is not suitable for further microminiaturization of the MOS transistors of the integrated circuit. The microminiaturization has the undesired effect that it can interfere with the task of bringing the circuit constants of the protecting circuit to suitable values.

FIG. 2 shows an equivalent circuit of the protecting circuit in FIG. 1. Resistor 20 shown in FIG. 2 corresponds to transistor 16 in a conductive state and has spreading resistance Rb. Resistance Rb is specified according to the substrate in which the MOS transistor integrated circuit is formed.

The electric field intensity in the gate oxide of the MOS transistor depends upon the gate voltage of the MOS transistor and the thickness of the gate oxide. It is known that rupture of the gate oxide normally occurs at the electric field intensity higher than 7 or 8 MV/cm. When the gate oxide of transistor 10 is reduced to the thickness, for example, of 0.02 μm to 0.03 μm by microminiaturization, the gate voltage of transistor 10 is limited to 30 V, at the maximum, to avoid rupture of the gate oxide. The gate voltage of transistor 10 in the steady state is ordinarily represented by the following equation (1):

$$VC = (Rb/R + Rb) VO \ldots \quad (1)$$

where VO is a surge voltage applied to input terminal 12.

Since it is not possible to vary the value of resistance Rb when setting the VC under necessary conditions for preventing the gate oxide of transistor 10 from rupturing, resistance R must be increased as compared with that value it would have had before the microminiaturization. However, the increase in resistance R is not preferred, due to the decrease in the response speed when the integrated circuit is operated, and causes the following disadvantages. The voltage drop across resistor 14 increases proportionally to resistance R. Thus, when resistor 14 is formed of a polycrystalline silicon layer, an insulation breakdown might occurs in a field oxide film under the polycrystalline silicon layer. On the other hand, when resistor 14 is formed of a diffused layer, there might also be a junction breakdown between the diffused layer and the semiconductor substrate. Particularly in case of the junction breakdown, it can occur at a voltage drop lower than that in case of the insulation breakdown.

The value of resistance R of resistor 14 which can firmly prevent the gate oxide of transistor 10 from rupturing will be designated. For example, when a surge voltage is 3000 V, spreading resistance Rb is 50 ohms and the gate voltage of transistor 10 is 20 V, resistance R is necessarily 7.45 kΩ or higher, as per equation (1).

On the other hand, the value of resistance R of resistor 14 which can reliably prevent a field oxide film from insulatively breaking down can be determined. For example, when the upper limit of an applying voltage, capable of holding the electric field intensity between the field oxide films of 0.6 μm less than 7 MV/cm, is 400 V from the MIL standard test, the resistance is necessarily 1 kΩ or less.

As a result, when resistance R is set to 7.45 kΩ or higher in order to effectively obviate the rupture of the gate oxide of transistor 10, the field oxide film insulatively breaks down. On the contrary, when resistance R is set to 1 kΩ or lower in order to reliably prevent the field oxide film from insulatively breaking down, rupture of the gate oxide of transistor 10 occurs. If the voltage of junction 18 in not sufficiently reduced, not only does the possibility of rupture of the gate oxide of transistor 10 occur, but also the surge withstanding voltage of transistor 16 decreases.

FIG. 3 is an equivalent circuit of a testing circuit of MIL standards. This testing circuit has resistor 22 of 1.5 kΩ and capacitor 24 of 100 pF, which are connected in series between terminal 12 and terminal VSS in the test operation. Capacitor 24 is charged while switch 26 is opened. The charge stored in capacitor 24 is applied as a surge voltage to terminal 12 at the moment that switch 26 is closed. The MIL standards prove a sufficient practical use if the integrated circuit has a surge withstanding voltage of 1200 V.

SUMMARY OF THE INVENTION

An object of the present invention is to provide a protected MOS transistor circuit which can firmly prevent the rupture of the gate oxide of an input MOS transistor without causing trouble to an input protecting circuit and is also suitable for microminiaturization.

According to the present invention, there is provided a protected MOS transistor circuit comprising a semiconductor substrate, a reference terminal set to the substrate potential, an input terminal supplied with an input voltage, an input MOS transistor having a gate electrode insulatively formed over the substrate, first and second resistors insulatively formed over the substrate and connected in series between the input terminal and the gate electrode of the input MOS transistor, a first diode reversely connected between the reference terminal and the node of the second resistor and the gate electrode, and a second diode reversely connected between the reference terminal and the node of the first resistor and the second resistors.

DETAILED DESCRIPTION OF THE PREFERRED EMBODIMENTS

Figure 1:
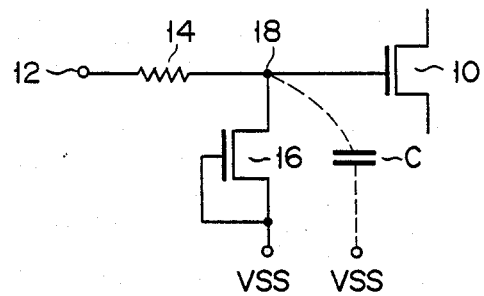
FIG. 1 shows a conventional input protecting circuit for a MOS transistor integrated circuit.
Figure 2:
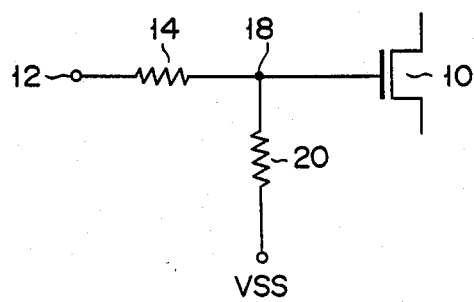
FIG. 2 shows an equivalent circuit of the input protecting circuit shown in FIG. 1.
Figure 3:
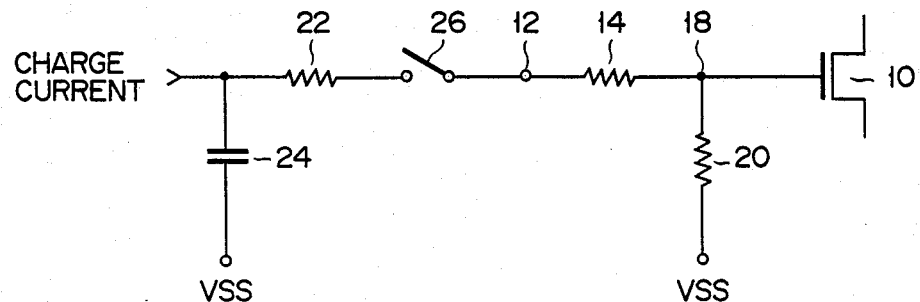
FIG. 3 shows an equivalent circuit of a testing circuit used for the surge withstanding test of the input protecting circuit in FIG. 1.
Figure 4:
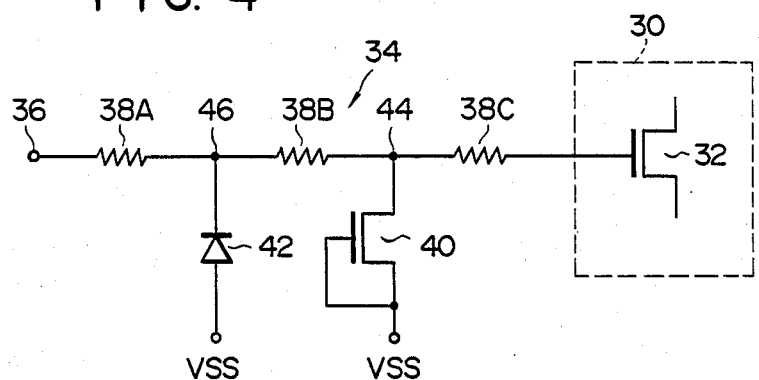
FIG. 4 shows a protected MOS transistor integrated circuit according to one embodiment of the present invention.

One embodiment of the present invention will now be described with reference to FIG. 4. FIG. 4 is a circuit diagram of a protected MOS transistor integrated circuit. The integrated circuit has function unit 30 formed on a single semiconductor substrate (not shown) such as a P-type silicon substrate. Unit 30 has a plurality of MOS transistors interconnected to obtain the desired function. The MOS transistors have, for example, gate oxides of 0.02 μm. Each MOS transistor has a source and drain formed in a depth of about 0.3 μm in the substrate. Input MOS transistor 32, shown in FIG. 4, is one of these MOS transistors. The gate of transistor 32 is connected to input terminal 36 through protecting circuit 34 to receive an input signal used in unit 30.

Protecting circuit 34 is provided to protect the gate oxide of transistor 32 from rupture when a surge voltage such as, for example, 3000 V is momentarily applied to terminal 36. Circuit 34 has resistors 38A, 38B, 38C connected in series between terminal 36 and the gate of transistor 32. More particularly, one end of resistor 38A is connected to terminal 36, and the other end is connected through resistor 38B to one end of resistor 38C. The other end of resistor 38C is connected to the gate of transistor 32. Each of resistors 38A to 38C is formed of a polycrystalline silicon layer which is formed over the substrate through a field oxide film interposed therebetween. The field oxide film has a thickness of about 0.1 μm. Resistor 38A is set, for example, to a resistance of 1 kΩ in a range of 500 Ω to 1.5 kΩ. Resistor 38B is set, for example, to a resistance of 250 Ω in a range of 100 Ω to 300 Ω. Resistor 38C is set, for example, to a resistance of 100 Ω to 200 Ω.

Protecting circuit 34 further has MOS transistor 40 having the same construction as transistor 32, and pn-junction diode 42. The gate and one end of the current path of transistor 40 are connected to power terminal VSS, set to reference potential equal to the substrate potential. The other end of the current path of transistor 40 is connected to node 44 between resistor 38B and resistor 38C. The cathode of diode 42 is connected to node 46 between resistor 38A and resistor 38B, and the anode is connected to terminal VSS. Transistor 40 has, similarly to transistor 32, n-type diffused regions formed in p-type silicon substrate in a depth of about 0.3 μm. Diode 42 has an n-type diffused region formed in the substrate in a depth deeper than the diffused regions of transistors 32, 40. The depth of the n-type diffused region is set to 0.5 μm to 2.0 μm. The n-type diffused region contacts with the p-type substrate so as to form the contact area of 2000 μm² to 3000 μm². Thus, diode 42 has a higher breakdown voltage than transistor 40.

Figure 5:
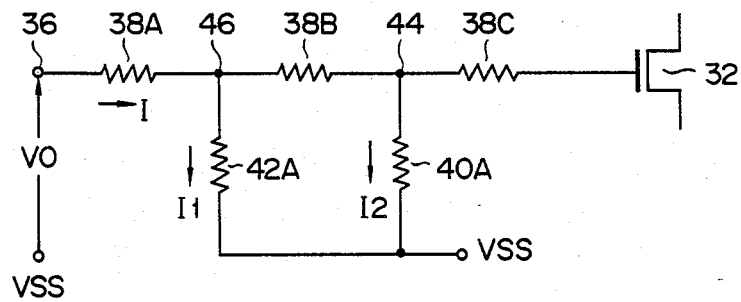
FIGS. 5 and 6 are views showing an equivalent circuit of the protected MOS transistor integrated circuit in FIG. 4 for describing the operating state of the input protecting circuit of the integrated circuit.

FIG. 5 is an equivalent circuit after transistor 40 and pn-junction diode 42 are conducted. Resistors 40A, 42A shown in FIG. 5 respectively represent spreading resistances in the substrate. Resistor 40A is connected between node 44 and the substrate, and resistor 42A is connected between node 46 and the substrate.

When terminal 36 receives surge voltage VO, voltage VO is divided in accordance with the resistances of resistors 38A, 38B, 42A, 40A and applied to node 44 as voltage VC.

Now, the value of voltage VC will be obtained by calculation. Assume that the current flowing in resistor 38A is I, the current flowing in resistor 42A is I1, the current flowing in resistor 40A is I2, the resistances of resistors 38A, 38B are respectively R1, R2, and the resistances of resistors 42A, 40A are respectively Rb.

Current I2 is equal to the value produced by dividing voltage VC of node 44 by resistance Rb of resistor 40A and represented by the following equation (2):

$$I2 = VC/Rb \ldots \text{Tm (2)}$$

The voltage drop of resistor 42A is equal to that in a series circuit of resistor 38B and resistor 40A, and the following equation (3) is formed:

$$Rb \cdot I1 = (R2 + Rb)I2 \ldots \text{Tm (3)}$$

Current I is equal to the value produced by dividing surge voltage VO by the combined resistance of resistors 38A, 38B, 42A, 40A and represented by the following equation (4):

$$I = VO/(R1+(Rb(R2+Rb)/Rb+(R2+Rb))) \quad (4)$$

Since current I is branched to currents I1 and I2, the following equation is satisfied:

$$I = I1+I2 \quad (5)$$

The case where resistor 38A is 1 kΩ, surge voltage VO is 3000 V, resistors 42A, 40A are set to 50 Ω, and voltage VC is set to 20 V for firmly preventing the rupture of the gate oxide of transistor 32 will now be considered. The resistance R2 of resistor 38B in this case will be obtained:

When 50 Ω is substituted for Rb and 20 V is substituted for VC in the equation (2), the following equation (6) is obtained:

$$I2 = 20/50 = 0.4 \text{ [A]} \quad (6)$$

Further, the value of current I2 obtained in the equation (6), i.e., 0.4 A and 50 Ω of Rb are substituted in the equation (3), current I1 is represented by the following equation (7):

$$I1 = (0.4/50)(R2+50) \quad (7)$$

I1 of the equation (7) and I of the equation (4) are substituted for the equation (5), the following equation (8) is obtained:

$$(0.4/50)(R2+50)+0.4 =$$
$$3000/(1000+(50/(R2+50)/50+(R2+50)) \quad (8)$$

In the equation (8), (R2+50) is substituted by Y, the equation (8) can be represented as below:

$$(0.4/50)Y+0.4 = 3000/(1000+(50\ Y)/50 +Y)) \quad (9)$$

The equation (9) can be represented as the following quadratic equation with respect to Y:

$$8.4Y^2-2180Y-13000 =0 \quad (10)$$

When the equation (10) is solved with respect to Y, Y has the value of about 309.5. Resistance R2 is equal to the value produced by subtracting this value by 50, and is resultantly 259.5 Ω. Thus, the resistance of resistor 38B in FIG. 4 is set to 250 Ω, near this value.

Therefore, if the surge voltage of 3000 V is applied to terminal 36 when resistances R1, R2 of resistors 38A, 38B are respectively set to 1 kΩ, 250 Ω, voltage VC of node 44 is limited to a sufficiently low value. Thus, the gate oxide of the transistor is protected against rupture.

Figure 6:
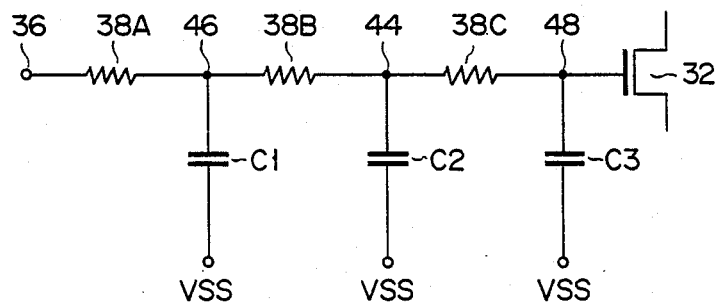

FIG. 6 is an equivalent circuit when transistor 40 and diode 42 are nonconductive. In FIG. 6, capacitor C1 represents the parasitic capacitance of node 46, which depends mainly on the junction capacitance between the diffused region of diode 42 and the substrate. Capacitors C2, and C3 respectively represent the parasitic capacitances of nodes 44 and 48. The capacitance of node 48 depends mainly on the gate capacitance of transistor 32.

In the embodiment described above, diode 42 has a diffused region deeper than that corresponding to the source and drain of transistor 32. Therefore, diode 42 is stronger than transistor 32 against junction breakdown. Though a higher voltage than in node 44 is applied to node 46, this voltage cannot cause breakdown of the pn-junction of diode 42.

Since diode 42 has a sufficiently large junction area, capacitor C1 has a larger capacitance. Therefore, capacitor C1 effectively reduces the peak voltage of node 46 in cooperation with resistor 38A. Further, since the capacitance of capacitor C1 is large, resistor 38A can be set to a relatively small resistance. Therefore, an input signal is not remarkably delayed due to an excessively large time constant in this portion when the integrated circuit is operated.

The peak voltage of node 44 is similarly effectively reduced in cooperation with resistor 38B and capacitor C2, and the peak voltage of node 48 is effectively reduced in cooperation with resistor 38C and capacitor C3. In other words, protecting circuit 34 can effectively prevent the rupture of the gate oxide of transistor 32 without disturbing the high speed operation of the integrated circuit.

In the embodiment described above, resistor 38A is formed not of the diffused layer formed in the semiconductor substrate but of the polycrystalline silicon layer formed through a field oxide film on the substrate. The reason is as will be described below. Resistor 38A directly receives a surge voltage applied to terminal 36. The breakdown voltage of pn-junction is in general low. Thus, when resistor 38A is formed of the diffused layer, a breakdown current initially flows through the diffused layer from input terminal 36 to the substrate when a surge voltage is supplied to the input terminal. Since this current is concentrated to a specific part of the junction between the diffused layer and the substrate, the junction of this portion is readily broken down. Once the rupture occurs, the diffused layer cannot serve as resistor 38A. On the other hand, when resistor 38A is formed of the polycrystalline silicon layer and a relatively thick field oxide film is interposed between the polycrystalline silicon layer and the substrate, resistor 38A has sufficiently high withstanding voltage as compared with the case that it is formed of the diffused layer.

Figure 7:
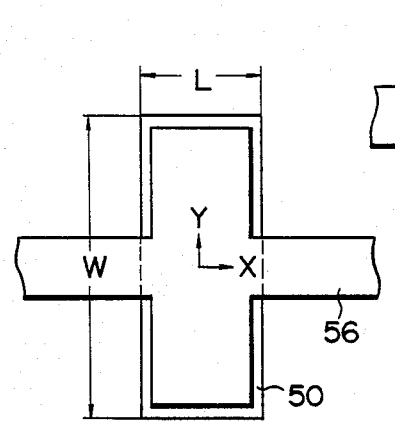
FIG. 7 shows a plane pattern of a diode in FIG. 4.
Figure 8A:
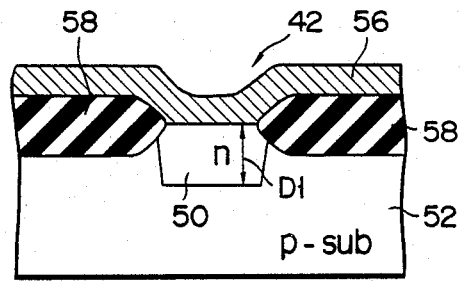
FIG. 8A shows the sectional construction of a diode in FIG. 4.
Figure 8B:
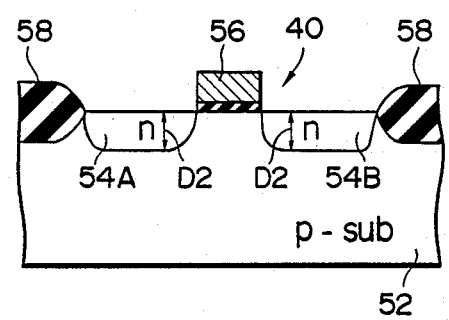
FIG. 8B shows the sectional construction of the diode-connected MOS transistor in FIG. 4.

FIG. 7 shows a plane pattern of a diode 42 of the above-mentioned embodiment. FIG. 8A shows a sectional construction of diode 42, and FIG. 8B shows a sectional construction of transistor 40.

N-type diffusion region 50 shown in FIG. 8A is formed in depth D1 in p-type semiconductor substrate 52 to form a diode 42 in cooperation with substrate 52. On the other hand, n-type diffusion regions 54A, 54B in FIG. 8B are formed in depth D2 in substrate 52 to form source and drain of transistor 40. Depth D1 is set to a value larger than depth D2. Impurity-doped polycrystalline silicon layer 56 is formed by depositing on region 50 and field oxide film 58. Layer 56 is patterned as resistors 38A, 38B as shown in FIG. 7, and layer 56 is provided with a resistance capable of directly contacting layer 50. Remaining layer 56 is also used as the drain electrode of transistors 40, the gate electrode 32, and resistor 38C as shown in FIG. 8B.

Region 50 has a substantially square shape in a plane as shown in FIG. 7. Region 50 has length L in direction X from terminal 36 toward transistor 32 and length W in direction Y perpendicular to the direction X. In the embodiment described above, length L is set to a value shorter than length W. In this case, an electric field concentrated to diode 42 is alleviated to improve the breakdown withstanding voltage.

Figure 9:
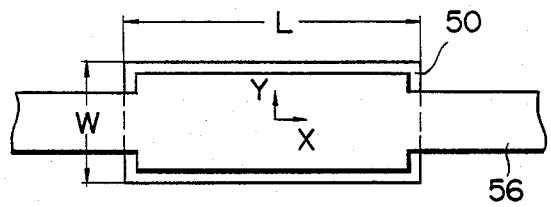
FIG. 9 shows a diode of a plane pattern different from the diode in FIG. 4.

FIG. 9 is an application example of diode 42 in FIG. 4. In FIG. 9, length L of diffused layer 50 is equal to or longer than length W. In this case, the parasitic capacitance and the parasitic resistance due to the pn-junction of diode 42 are provided to protect circuit 34 in a distributed constant manner. When a surge voltage is applied to one end of the layer 56 in direction X, the peak value of the surge voltage is gradually reduced in accordance with the distance from the end of layer 56. The charge is effectively discharged from the polycrystalline silicon layer to the substrate.

According to the embodiment described above, when a surge voltage is applied to the input terminal, the voltage applied to the gate of the input transistor connected to the terminal can be reduced without rupture of the input protecting circuit itself, thereby improving the surge withstanding voltage. Further, the input surge of high voltage can be sufficiently suppressed without deteriorating the response characteristic of the integrated circuit.

Figure 10:
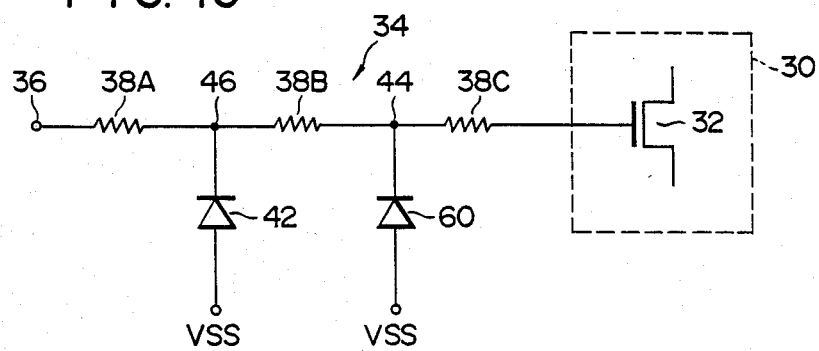
FIG. 10 shows a protected MOS transistor integrated circuit according to another embodiment of the present invention having two pn-junction diodes.

The present invention is not limited to the particular embodiments described above. Various other changes and modifications may be made within the spirit and scope of the present invention. For example, in the embodiments described above, transistor 40 is used as a protecting element. However, a gate control diode may be used. Further, transistor 40 may be substituted for pn-junction diode 60 of the same construction as diode 42 as shown in FIG. 10.

According to the present invention as described above, in the semiconductor integrated circuit having the input protecting circuit, the voltage applied to the gate of the input transistor connected to the input terminal can be reduced without rupture of the input protecting circuit itself when a surge voltage is applied to the input terminal, thereby improving the surge withstand voltage.

What is claimed is:
1. A protected MOS transistor circuit comprising:
a semiconductor substrate with a top surface;
an input terminal supplied with an input voltage signal;
an input MOS transistor including an insulated gate and also including source and drain regions formed in the top surface of said semiconductor substrate;
an impurity-doped semiconductor layer insulatively formed over said top surface of said substrate and connected between said input terminal and said insulated gate of said input MOS transistor, said semiconductor layer acting as a transfer line for transferring said input voltage signal to the insulated gate of said input MOS transistor;
first diode means connected in a reverse-biased orientation between a power source terminal and a first portion of said semiconductor layer; and
second diode means also connected in the reverse-biased orientation between said power source terminal and a second portion of said semiconductor layer which is located closer to said input terminal than said first portion of said semiconductor layer, said second diode means having
a diffusion region formed in the top surface of said semiconductor substrate and extending laterally in a transverse direction to said semiconductor layer such that said diffusion region is longer in a transversal direction of said semiconductor layer than in a longitudinal direction of said layer, said diffusion region, together with said semiconductor substrate, constituting a pn junction;
wherein said second portion of said semiconductor layer is elongated in the transversal direction of said semiconductor layer and contacts substantially the entire top surface of said diffusion region.

2. A protected MOS transistor circuit according to claim 1, wherein said first diode means has a diffusion region which is formed in the top surface of said semiconductor substrate and extends horizontally across said semiconductor layer, constitutes a pn junction together with said semiconductor substrate, and is longer in the transversal direction of said semiconductor layer than in the longitudinal direction thereof; and
wherein said first portion of said semiconductor layer is elongated in the transversal direction of said semiconductor layer and contacts substantially the entire top surface of said diffusion region of said first diode means.

3. A protected MOS transistor circuit according to claim 1 wherein said second diode means has a breakdown voltage higher than that of said first diode means.

4. A protected MOS transistor circuit according to claim 3 wherein said first diode means is a protection MOS transistor having source and drain regions separated by a current path formed in the surface of said substrate and having an insulated gate connected to one end of said current path of said protection MOS transistor.

5. A protected MOS transistor circuit according to claim 4 wherein said diffusion region of the second diode means is deeper than the source and drain regions of said protection MOS transistor.

6. A protected MOS transistor circuit according to claim 5 wherein said semiconductor layer has a resistance of 100 to 300 ohms between said first and second diode means and 500 ohms to 1.5 kilohms between said second diode means and said input terminal, and wherein said diffusion region has a depth of 0.5 to 2.0 microns and a pn junction area of at least 2000 square microns.

7. A protected MOS transistor circuit according to claim 1 wherein said semiconductor layer is formed of an impurity-doped polycrystalline silicon.

8. A protected MOS transistor circuit according to claim 7 wherein said insulated gate is formed of an impurity-doped polycrystalline silicon.

* * * * *